United States Patent [19]

Pennings et al.

[11] 4,109,846
[45] Aug. 29, 1978

[54] AUTOMATIC HEIGHT SENSOR FOR SEMICONDUCTOR BONDING TOOL, WAFER PROBE OR THE LIKE

[75] Inventors: Matheus D. Pennings, Los Altos Hills; Billy B. Tippin, Saratoga, both of Calif.

[73] Assignee: Sola Basic Industries, Inc., Milwaukee, Wis.

[21] Appl. No.: 797,622

[22] Filed: May 17, 1977

[51] Int. Cl.² .................................... H01L 21/68
[52] U.S. Cl. .................... 228/4.5; 228/6 A; 228/9; 33/174 PC
[58] Field of Search ............ 228/4.5, 6 A, 8–10; 33/174 L, 174 PC; 51/2 AA

[56] References Cited

U.S. PATENT DOCUMENTS

| 2,116,593 | 5/1938 | Bouvier et al. | 51/2 AA |
| 3,125,906 | 3/1964 | Johnson | 228/4.5 |
| 3,245,148 | 4/1966 | Whitney | 33/174 L |
| 3,610,508 | 10/1971 | Laubmeyer | 228/6 A |
| 3,844,047 | 10/1974 | Carson | 33/166 |

*Primary Examiner*—Al Lawrence Smith
*Assistant Examiner*—K. J. Ramsey
*Attorney, Agent, or Firm*—Blakely, Sokoloff, Taylor & Zafman

[57] ABSTRACT

A height sensor is disclosed which permits a tool to sense the height of a semiconductor die, or the like, above a work surface such as a bonding table. A tool arm moves transverse to the work surface and is interconnected to a cam by a second arm. The second arm is disengageable from the first arm and disengages the first arm when the tool contacts the semiconductor die. Sensing means are provided to detect the separation of the two arms.

13 Claims, 9 Drawing Figures

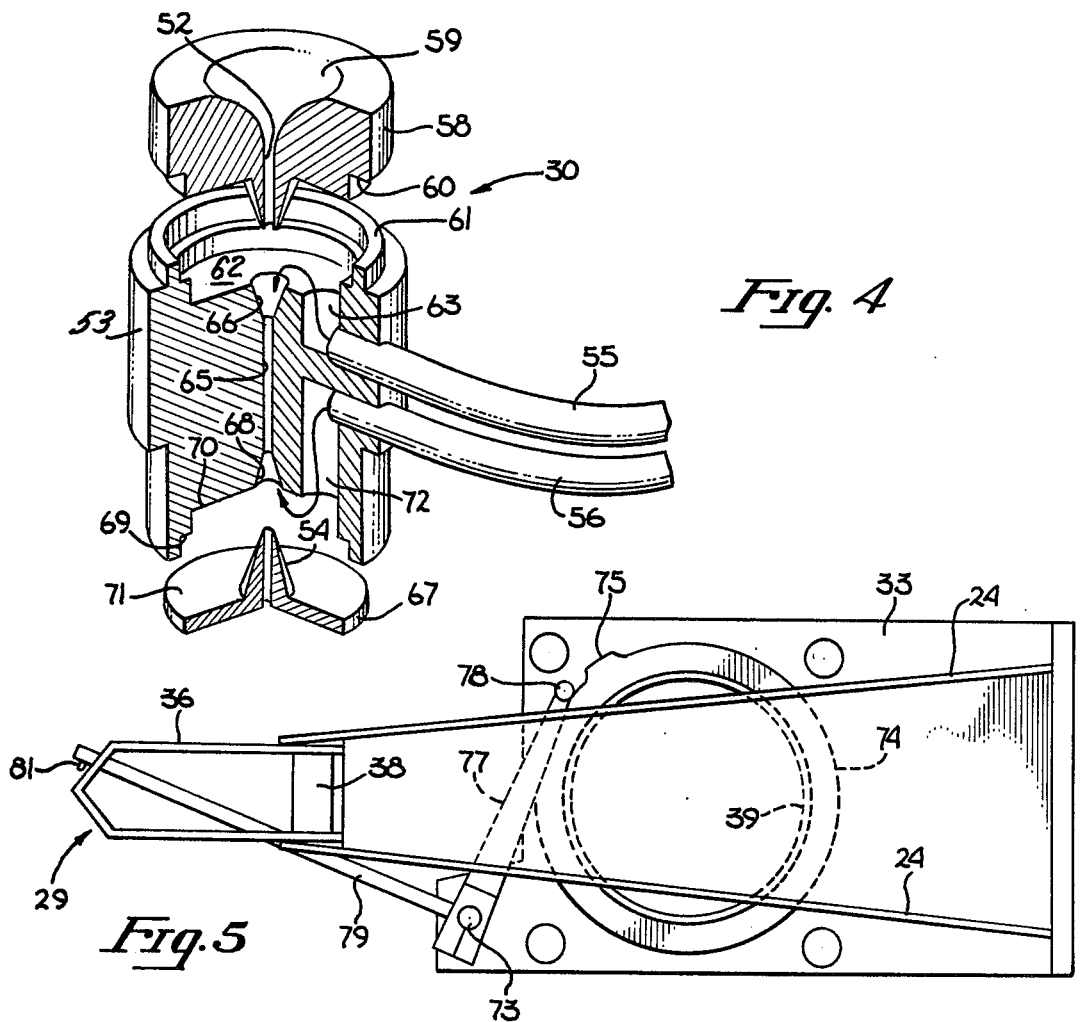
Fig. 4
Fig. 5
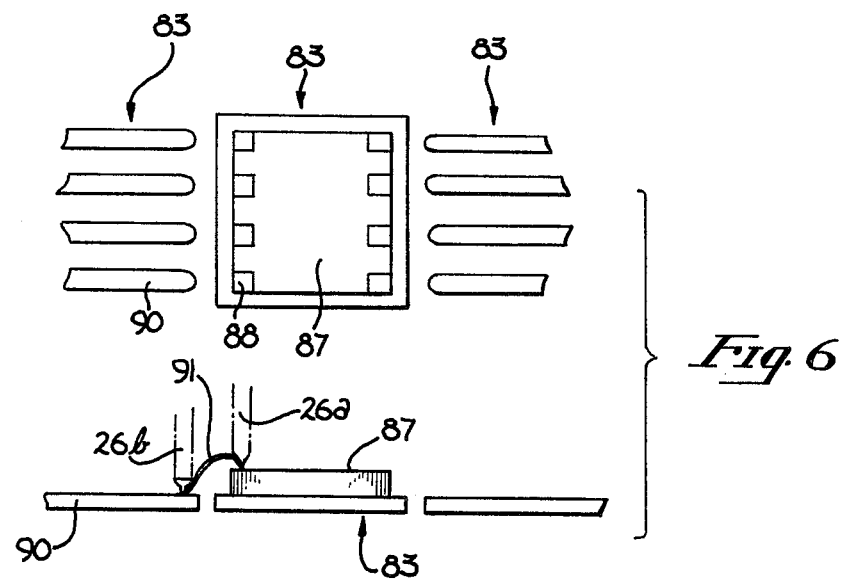
Fig. 6

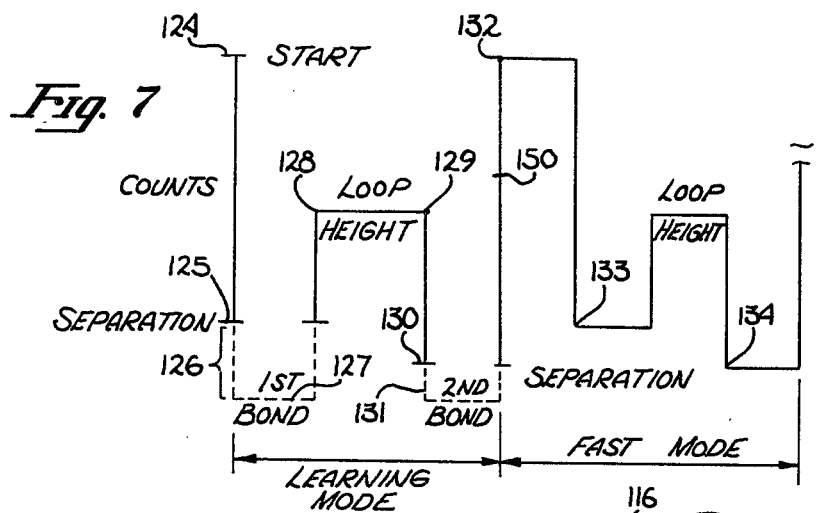
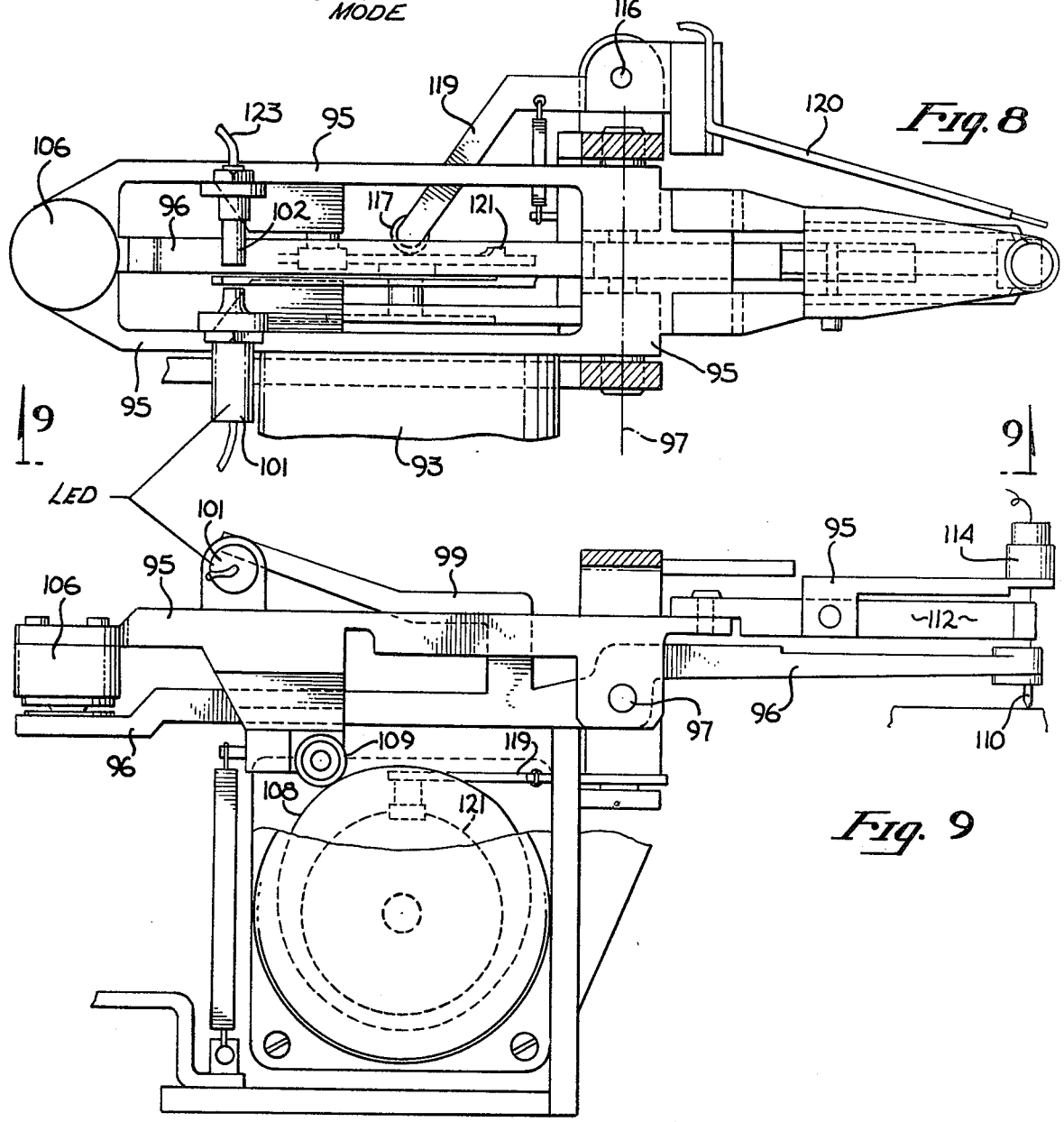

AUTOMATIC HEIGHT SENSOR FOR SEMICONDUCTOR BONDING TOOL, WAFER PROBE OR THE LIKE

BACKGROUND OF THE INVENTION

1. Field of the Invention

The invention relates to the field of automatic semiconductor bonders, probers, and like devices.

2. Prior Art

In automated semiconductor bonders, wafer probers, and like devices, it is necessary to have a capillary, probe, or similar tool or instrument contact a semiconductor wafer or die. The wafer or die is typically mounted on a work surface such as a bonding table. The height of the die or wafer varies from part-to-part, and thus, the distance the tool or instrument must travel before contact is unkown. For a general discussion of this problem and a proposed solution for an automatic wafer prober, see "Microprocessor Controls Fully Automatic Wafer Prober", *Solid State Technology*, September 1975 by T. Roland Fredriksen beginning on page 49, particularly see FIG. 7.

For automatic bonders the height sensing problem is more difficult since a bonding tool, such as a capillary, must first contact the semiconductor die and then connect a wire to a lead frame. The height of the lead frame is different than the height of the die. Thus, the Z-drive for the capillary must be capable of sensing two different heights and accurately and rapidly driving the capillary to these different heights. One prior art apparatus for accomplishing this employs two separate cams which drive two arms. Each arm is independently set for a different height.

As will be seen, the presently described apparatus provides unique means for sensing height which additionally provides numerous other features. The disclosed device allows the capillary, by way of example, to make a "soft landing" on the bonding pad since the exact height of the pad is known. Thus a bonding apparatus or other apparatus may operate at a faster speed without striking the wire with an intolerable impact when contacting the bonding pad. Also, after the second bond is made, the capillary may be raised to a controlled distance above this bond before the wire is clamped and then moved an additional distance to break-off the wire. In this manner, a predetermined length of wire projects from the end of the capillary, thereby permitting formation of consistent, molten "balls" needed for the next bond. Without the described height sensing feature this could not be accomplished since the length of wire extending from the end of the capillary is effected by the height of the second bonding surface.

SUMMARY OF THE INVENTION

An apparatus for controlling the movement of a bonding tool probe, or like device in an automatic bonder, wafer prober, or like apparatus is described. A first arm is mounted for transverse movement relative to a work surface. This arm includes the bonding tool or probe. The apparatus includes a second arm which is mounted for movement with the first arm. The second arm disengages the first arm when the tool or probe contacts a surface. This disengagement is sensed and employed to determine the distance traveled by the tool or probe. In the presently preferred embodiment, the second arm is driven by a stepping motor which is connected to the second arm through a cam and cam follower. Both arms are pivotally mounted for movement about a common axis. In one embodiment, the disengagement or separation of the arms is sensed by a differential transformer, in another embodiment, photodetection means are employed.

BRIEF DESCRIPTION OF THE DRAWINGS

FIG. 4 is a cutaway view of the wire feeding and tensioning device employed by the bonder.

FIG. 5 is a cross-sectional, plan view of the apparatus of FIGS. 2 and 3.

FIG. 6 is an elevation and plan view of a lead frame and semiconductor die. These views are used to illustrate the difference in height between the semiconductor die and the lead frame.

FIG. 7 is a graph used to illustrate the movement of the capillary shown in FIGS. 2 and 3.

FIG. 8 is a plan view of an alternate embodiment for the height sensing apparatus; and FIG. 9 is an elevation view of the apparatus of FIG. 8 generally taken through section 9—9 of FIG. 8.

DETAILED DESCRIPTION OF THE INVENTION

An apparatus is described for sensing height and which includes the Z-drive for an automatic semiconductor bonder, wafer prober, or the like. In the following description, the invented apparatus is described in conjunction with an automatic bonder employing a capillary as a bonding tool. It will be apparent to one skilled in the art that the apparatus may be employed in other applications such as in a wafer prober.

Figure 1:
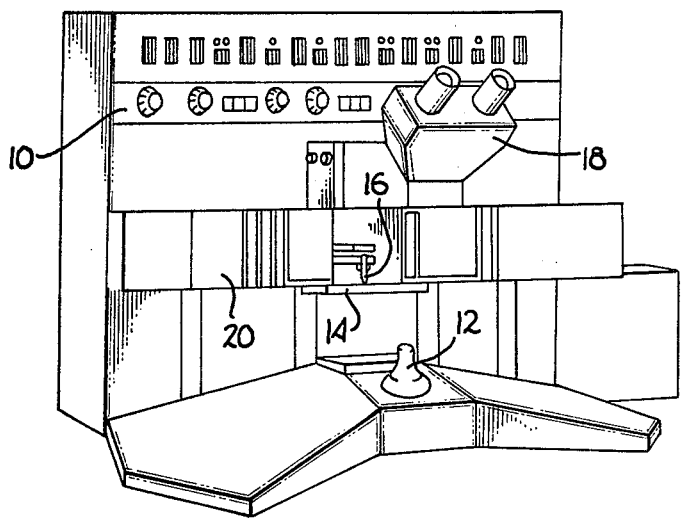
FIG. 1 is a perspective view of an automatic bonder.

Referring to the automatic bonder illustrated in FIG. 1, this apparatus includes a control panel 10, bonding table 14, capillary 16, aligning means illustrated as microscope 18, alignment control 12, and a magazine 20. In operation lead frames which include semiconductor dies are fed from the magazine 20 onto the bonding table 14. After an initial alignment, the capillary 16 bonds leads between the semiconductor die and the fingers of the lead frame. Briefly referring to FIG. 6, a lead frame 83 is illustrated which includes a semiconductor die or "chip" 87. The capillary automatically bonds leads between the pads on the die, such as pad 88, and the fingers of the lead frame, such as finger 90. One such lead, lead 91, is illustrated in FIG. 6.

After the leads for each die are bonded, the lead frame is advanced from the magazine 20 and the next die is brought onto the bonding table 14. (See copending application Ser. No. 798,114 filed May 18, 1977 describing the magazine system employed in the presently preferred embodiment.)

After each die is moved onto the bonding table, an operator sights through the alignment microscope 18 and with use of control 12 determines the location of two of the bonding pads on the die. The automatic processor then performs a standard translational computation to determine the location of all the pads on that particular die. This information is used by the bonder to drive the apparatus shown in FIGS. 2 and 3 in the X and Y-directions. Well-known microcomputers and related circuits along with stepping motors may be employed for this purpose.

While in FIG. 1 alignment is performed with a microscope 18, it will be apparent that other alignment means may be employed. For example, a fiber optic cable may be employed to display each die on a cathode ray tube and the alignment then performed by viewing the tube, rather than sighting directly onto the die. Also the alignment may be performed automatically by employing known pattern recognition techniques.

Figure 2:
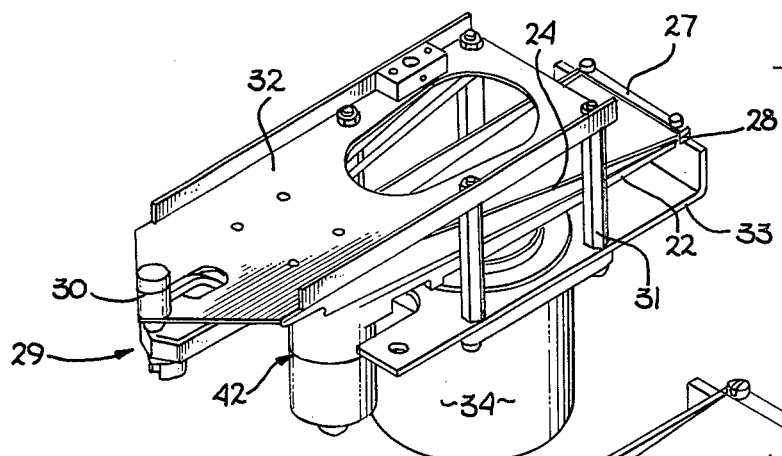
FIG. 2 is a perspective view of the height sensing apparatus of the present invention.
Figure 3:
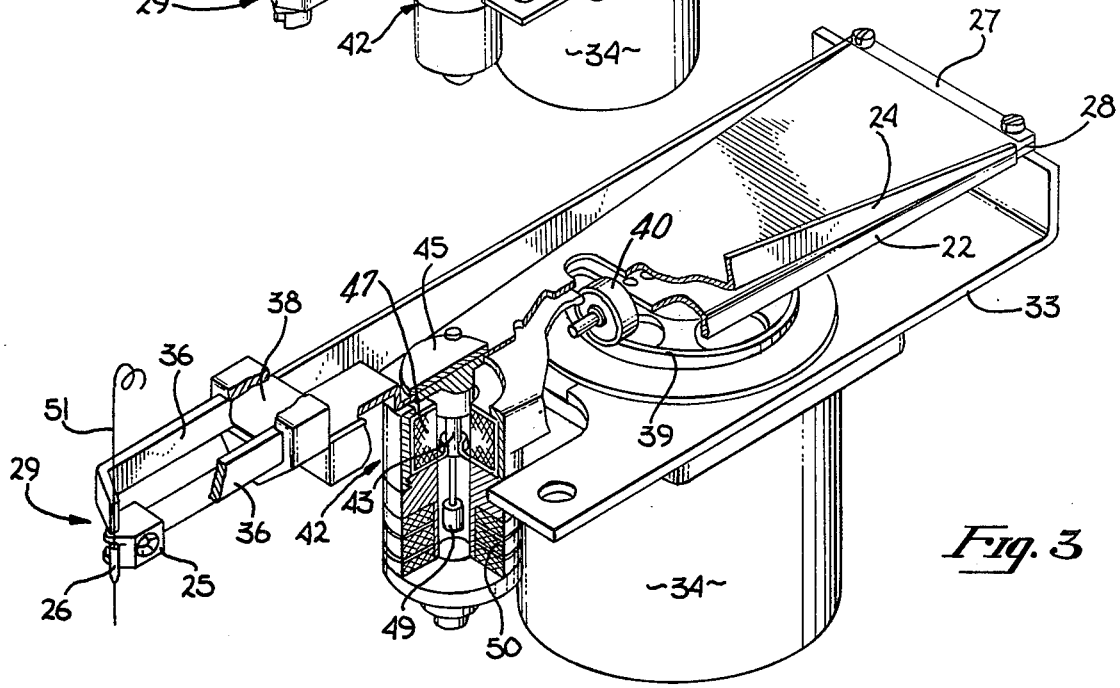
FIG. 3 is an enlarged view of the apparatus of FIG. 2 with a portion of the apparatus cutaway to reveal underlying details.

Referring now to FIGS. 2 and 3, the support 33 mounts the apparatus of these figures onto the X and Y-driving means of the bonder of FIG. 1. The apparatus of FIGS. 2 and 3, in addition to sensing height, provides the Z-drive for the capillary 26.

A generally rectangular cam following arm 22 and a capillary carrying arm 24 are pivotally mounted for movement about at axis 28 by hinge 27. These arms are urged downward by the action of a spring (not shown) which is coupled to the shaft of roller 40 (FIG. 3). Arm 24 is urged to follow arm 22 by the coupling provided by solenoid 42. The cam following arm 22 is connected to a cam following roller 40 which engages a cam 39. The cam 39 is coaxially mounted with a stepping motor 34 on the support 33. Thus as the stepping motor advance, arm 22 pivots about axis 28.

The arms 22 and 24 are interconnected through a solenoid 42. The solenoid housing is secured to arm 22 and includes the solenoid coil 47 and the windings 50 of a differential transformer. The plunger 43 of the solenoid and the slug 49 of the differential transformer are mounted on a common shaft which is coupled to the arm 24 at plate 45. The plunger 43 and slug 49 axially move within the solenoid coil 47 and the transformer winding 50, respectively.

The end of arm 24 opposite axis 28 includes a capillary mounting block 25 which receives the capillary 26. As illustrated in FIG. 3, a wire 51 is disposed through this capillary. This wire passes through a wire clamp 29 which includes jaws 36. (Note one of the jaws 36 is cutaway in FIG. 3). The jaws 36 are driven by a clamp driver 38 to permit the selective clamping of the wire 51; the clamp 29 is secured to arm 24 above the capillary 26.

As best illustrated in FIG. 2, the apparatus includes an upper frame member 32 which is rigidly coupled to support 33 through standards 31. A wire feeding and tensioning device 30 is mounted to frame 32 directly above the clamp 29. This device will be described in detail in conjunction with FIG. 4.

Referring now to FIG. 7, the operation of the apparatus of FIG. 2 and 3 will be explained in conjunction with this graph. The horizontal direction of this graph represents time; the vertical direction represents angular movement (about axis 28) of the arms 22 and 24 of FIG. 2. At the starting point 124 the arms 22 and 24 are locked together and move as a single unit. A current in the solenoid coil 47 assures that arm 24 will remain in engagement with arm 22. At point 124 the arms are in their uppermost position as determined by the uppermost point on cam 39. As the stepping motor 34 rotates the cam 39, the roller 40 follows the cam downwardly, thereby moving the capillary 26 towards the work surface. At point 125 in FIG. 7 the capillary 26 contacts the die as shown by capillary position 26a of FIG. 6. The stepping motor, however, continues to rotate the cam, and the cam following arm 22 continues to follow the cam downwardly to its lowest possible position. As this occurs, arm 22 separates (point 125) from arm 24. The continued downward travel of the arm 22 is shown by segment 126 of FIG. 7. During the period 127, the first bond occurs, that is, a bond to the pad 88, as shown by FIG. 6.

The separation of arms 22 and 24 is sensed by the differential transformer. The movement of the slug 49 within the windings 50 is detected and provides a signal at the instant of separation. Referring again to FIG. 7, a digital counter is employed to determine the number of steps of rotation of the stepping motor 34 between points 124 and 125. The signal provided by the differential transformer terminates the counting within this digital counter. The contents of this counter provides the bonder with a number which represents the height of the die above the working surface. This number is stored by the bonder.

After the first bond has been completed, the stepping motor continues to rotate so as to cause the arm 22 to rise and engage the arm 24. The capillary is then raised above the die a predetermined adjustable distance, which distance provides the correct wire loop. This distance is shown at point 128 in FIG. 7. A knob on the control panel 10 (FIG. 1) allows this distance to be set to the predetermined distance. This distance is not affected by variations in die height. The X and Y-driving means for the bonder now drives the capillary above a finger of the lead frame such as finger 90 of FIG. 6. This is shown at point 129 of FIG. 7.

The capillary is next brought downward in the same manner as previously described for the second bond. When the capillary contacts the finger 90 (shown as capillary 26b of FIG. 6), the arms 22 and 24 again separate and this separation is detected by the differential transformer. As in the previous case, the arm 22 continues to follow the cam downwardly after separation from arm 24 as shown by segment 131. Following the completion of the second bond, the cam drives arm 22 into engagement with arm 24 and then lifts the arms to their uppermost position shown as point 132. The counter is again employed to determine the number of steps between points 129 and 130.

An important feature of the disclosed device is that since the height of the lead frame is known, a consistent predetermined length of wire may be left extending from the capillary. For example, as shown by point 150, the clamp may be activated at this point to tear-off the wire. The exact length of the wire left extending may be adjusted by selection of the clamping point. Moreover, since the height of the lead frame is known, the same length of wire may be left even when there are variations in height. The size of molten "ball" formed from the extending wire may be consistent thereby providing a more reliable bond.

The bonding of the ends of lead 91 of FIG. 6, as above described, is shown as the learning mode in FIG. 7. The learning mode may be repeated periodically or for each different part processed by the bonder. During this mode, as described, by noting the separation points of arms 22 and 24, the height of the substrate and the height of the lead frame fingers above the bonding table are determined. In subsequent bonds, since these heights are now known, the stepping motor is employed to more rapidly drive the capillary to the pads on the semiconductor die and the fingers of the lead frame. For example, the stepping motor may quickly drive the capillary to point 133. In practice, the capillary is decelerated before contact by employing microsteps, a few steps before the known contact point. To account for minor height variations the cam is rotated one or two steps beyond the known contact point to assure contact. (Each step, in the presently preferred embodiment, corresponds to 2.2 mils). Thus there will be some separation of the arms during bonding. By controlling the current through the solenoid the force with which the capillary engages the bonding pad may be controlled.

In the presently preferred embodiment, well-known tailless thermocompression ball and stitch bonding is employed, although other methods may be employed. After the second bond for each lead is completed, the clamp 29 clamps the wire after the capillary has risen a predetermined distance above the bond. When the wire is clamped since it has already been weakened by the capillary tip, it breaks leaving a predetermined length of wire extending from the end of the capillary. Through means of a torch which shall now be described, the wire is melted and a molten ball is formed at the end of the capillary.

Referring now to FIG. 5, the capillary carrying arm 24 along with the clamp 29 are again illustrated. A torch 81 which may be a gas torch or electronic torch is mounted at the end of arm 79. Arm 79 is transversely mounted with lever 77 at pivot 73 on support 33. A roller 78 engages a cam 74, which cam is concentrically mounted with cam 39 on the stepping motor. The cam 74 includes a protrusion 75. When this protrusion contacts the roller 78, it urges the torch 81 toward the wire. In this manner the molten ball is formed at the end of the capillary. The opening and closing sequence of the clamp 29 is synchronized with the bonding operation in a well-known manner. See U.S. Pat. Nos. 3,448,910 and 3,358,897 for a complete discussion of this bonding technique.

Referring now to FIG. 4, the wire tensioning and feeding device 30 of FIG. 2 is shown in detail. This device provides a pneumatic means for feeding a wire through the device, that is, self-threading and also means for tensioning the wire once threaded through the device. In the prior art, capillary wire feeding devices are known, for example, see U.S. Pat. No. 3,319,859 and also see U.S. Pat. No. 3,363,818 entitled "Spool Mount For Wire Feed Device". However, unlike these prior art devices, the device of FIG. 4 provides both means for feeding and means for tensioning the wire.

The device of FIG. 4 includes a generally cylindrical housing 53 with an axially disposed bore 65. The inlet side of the bore 65 includes a countersink 66; the outlet end of bore 65 terminates in a countersink 68. One end of the housing 53 defines an annular lip 61 which cooperatively engages the annular shoulder 60 of the inlet cap 58. The generally cylindrical inlet cap 58 includes a centrally disposed bore 52 which aligns with bore 65. One end of bore 52 includes an inlet countersink 59 while the other end terminates in a tapered protrusion 57. At the other end of the housing 53 a counter-bore defines an annular shoulder 69. A disc-like end cap 67 which includes a bore which aligns with bore 65 engages this shoulder. A tapered protrusion 54 extends from surface 71 of end cap 67 into the countersink 68 when the end cap is brought in contact with shoulder 69.

When the shoulder 60 engages lip 61, a cavity 62 is defined between these two members. This cavity communicates with an inlet port 63 which is coupled to the pneumatic line 55. Similarly, when the end cap 67 engages shoulder 69, a cavity is defined between the surfaces 70 and 71 of the housing 53 and cap 67, respectively. This cavity communicates with the port 72, which port is coupled to receive fluid from the pneumatic line 56.

To feed a wire through the device of FIG. 4, a fluid such as air or nitrogen is fed into line 55. No fluid is passed through line 56. This fluid enters through port 63 and flows into cavity 62. The fluid is then directed along the exterior of taper 57 into the countersink 66, along the bore 65, and then out through the end cap 67. The fluid flow through this path causes a pressure drop within the bore 52 of the inlet cap 58, thereby drawing the wire into the countersink 59, through the bores 52 and 65 and then through the end cap 67. In this manner, wire is automatically fed through the device 30, wire clamp and capillary.

Once the wire is fed through the device, fluid flow in line 55 is terminated and flow is provided through line 56. This flow enters port 72 and then flows into the cavity defined by surfaces 70 and 71. The fluid is then directed along the taper 54 into the countersink 68, and upwardly through the bore 65. The flow of fluid in this direction provides a constant tension on a wire disposed through the device 30. (The closed wire clamp or the molten ball (after flame off) prevent the wire from being blown out of the device when tensioning is required.) The amount of this tension may be readily adjusted by adjusting the fluid flow in line 56. This is in sharp contrast to the limited tensioning control provided by prior art spring tensioning devices.

Referring now to FIGS. 8 and 9, an alternate embodiment for the apparatus shown in FIGS. 2 and 3 is illustrated. Again, the apparatus includes a capillary carrying arm 96 and a cam following arm 95. Note that unlike the previous embodiment the cam following arm is the upper arm while the capillary carrying arm is the lower arm. Arms 95 and 96 are hinged at a common axis 97. The arms engage and disengage one another in a similar manner to the previous embodiment and are held together by a solenoid 106. The cam following arm 95 includes a cam following roller 109 which engages a cam 108. The cam 108 is driven by the stepping motor 93. Note that in this embodiment the stepping motor 93 is mounted generally horizontally and that the cam wheel rotates in a general vertical plane.

Unlike the previous embodiment, optical means are employed to detect the separation of arms 95 and 96. This optical means includes a finger 99 which extends from the capillary carrying arm 96. This finger is disposed adjacent to a beam of light emitted by the light-emitting diode (LED) 101. The beam of light from this diode is directed at a photodiode 102. The LED and the photodiode are mounted on the arm 95. When relative motion occurs between the arms 95 and 96, the finger 99 interrupts the beam of light from the LED 101 and the loss of light on the photodiode 102 is readily detected on lead 123. The signal on this lead is employed to detect the separation of the arms in an identical manner to the signal received from the differential transformer of FIGS. 2 and 3.

In the embodiment of FIGS. 8 and 9, a wire tensioning and feeding device 114, which may be identical to the device 30 of FIG. 4, is coupled to the arm 95. Wire from this device passes through the clamp 112 to the capillary 110 in the same manner as with the embodiment of FIGS. 2 and 3. A torch arm 120 pivots about point 116 and is driven by the lever 119. Lever 119 engages a cam 121 through the cam following roller 117.

The apparatus of FIGS. 8 and 9 is employed in the same manner as the apparatus of FIGS. 2 and 3 for detecting the height of a semiconductor die or lead frame above a work surface. During the learning cycle, when the capillary 110 makes contact, the cam 108 continues to rotate thereby causing the arms 95 and 96 to separate. This separation is detected by the photodiode 102 and is used in a similar manner with a digital counter to determine height.

Thus, an automatic height sensor for a semiconductor bonding tool, wafer probe, or the like, has been described.

We claim:

1. In an automatic semiconductor bonder or prober employing a bonding or probing tool, an apparatus for controlling the movement of said bonding or probing tool generally transverse to a surface comprising:
   a first arm mounted for transverse movement relative to said surface, said first arm including said bonding or probing tool;
   a second arm mounted for movement with said first arm;
   coupling means for coupling said first arm to said second arm, said coupling means decoupling said first arm from said second arm when said tool contacts a bonding pad, lead frame or the like;
   sensing means for sensing relative movement between said first and second arms;
   recording means responsive to said sensing means for recording a parameter which is a function of the position of said tool when said relative movement occurs; and
   drive means coupled to said second arm for driving said second arm and said first arm when said first arm is coupled to said second arm by said coupling means;
   whereby when said tool engages said bonding pad, lead frame, or the like which is on said surface, said first and second arms separate and said recording means records a parameter which is a function of the position of said tool, thereby allowing a height determination of such bonding pad, lead frame, or the like.

2. The apparatus defined by claim 1 wherein said drive means includes a stepping motor and cam.

3. The apparatus defined by claim 1 wherein said first and second arms are pivotally mounted for movement about the same axis.

4. The apparatus defined by claim 1 wherein said coupling means comprises a solenoid.

5. In an automatic bonder having a capillary or the like, and apparatus for controlling the movement of said capillary generally transverse to a bonding table comprising:
   a first arm mounted for transverse movement relative to said bonding table, said first arm including said capillary;
   a second arm mounted for selective movement with said first arm;
   coupling means for coupling said first arm to said second arm, said coupling means decoupling said first arm from said second arm when said capillary contacts a bonding pad, lead frame, or other surface;
   sensing means for sensing relative movement between said first and second arms;
   recording means responsive to said sensing means for recording a parameter which is a function of said capillary position when said relative movement occurs; and
   drive means coupled to said second arm for driving said second arm and said first arm when said first arm is coupled to said second arm by said coupling means;
   whereby when said capillary engages said bonding pad, lead frame, or other surface, said first and second arms separate and said recording means records a parameter which is a function of the position of said capillary, thereby allowing a height determination of said bonding pad, lead frame, or the like above said bonding table.

6. The apparatus defined by claim 5 wherein said first and second arms are pivotally mounted for movement about the same axis.

7. The apparatus defined by claim 6 wherein said drive means includes a stepping motor and a cam.

8. The apparatus defined by claim 7 wherein said second arm includes a cam follower which is urged against said cam.

9. The apparatus defined by claim 8 wherein said coupling means includes a solenoid.

10. The apparatus defined by claim 9 wherein said sensing means includes a photodetector.

11. In an automated bonder for bonding lead to semiconductor dies, or the like, an apparatus for sensing distance, comprising:
   a tool holding member for holding a bonding tool, said member mounted to permit transverse movement of said tool relative to such semiconductor die, or the like;
   a driver means for driving said tool holding member;
   a coupler interconnecting said driver means and said tool holding member, said coupler disengageable from said tool holding member when said bonding tool contacts said semiconductor die or the like;
   sensing means for sensing disengagement of said coupler and said tool holding member; and
   recording means responsive to said sensing means for recording a parameter which is a function of the position of said bonding tool;
   whereby when said tool is bought into contact with said semiconductor die, or the like, and said disengagement sensed, a parameter which is a function of the position of said tool is recorded, thereby providing a distance determination.

12. The apparatus defined by claim 11 wherein said tool holding member and said coupler each comprise arms which pivot about a common axis.

13. The apparatus defined by claim 12 wherein said driver means includes a stepping motor and a cam.

* * * * *